US008225153B2

(12) United States Patent
Redondo et al.

(10) Patent No.: US 8,225,153 B2
(45) Date of Patent: Jul. 17, 2012

(54) TOLERANT IN-SYSTEM PROGRAMMING OF FIELD PROGRAMMABLE GATE ARRAYS (FPGAS)

(75) Inventors: Randall G. Redondo, Salt Lake City, UT (US); Thomas Michael Richards, West Jordan, UT (US)

(73) Assignee: GVBB Holdings S.A.R.L., Luxembourg (LU)

( * ) Notice: Subject to any disclaimer, the term of this patent is extended or adjusted under 35 U.S.C. 154(b) by 149 days.

(21) Appl. No.: 12/311,877

(22) PCT Filed: Nov. 21, 2006

(86) PCT No.: PCT/US2006/044951
§ 371 (c)(1),
(2), (4) Date: Apr. 16, 2009

(87) PCT Pub. No.: WO2008/048297
PCT Pub. Date: Apr. 24, 2008

(65) Prior Publication Data
US 2010/0281318 A1    Nov. 4, 2010

Related U.S. Application Data

(60) Provisional application No. 60/851,954, filed on Oct. 16, 2006.

(51) Int. Cl.
*G01R 31/28* (2006.01)
(52) U.S. Cl. ........................ 714/725; 714/727
(58) Field of Classification Search ............. None
See application file for complete search history.

(56) References Cited

U.S. PATENT DOCUMENTS

| | | | |
|---|---|---|---|
| 5,457,408 A | 10/1995 | Leung | |
| 5,867,507 A | 2/1999 | Beebe et al. | |
| 5,999,014 A * | 12/1999 | Jacobson et al. | 326/38 |
| 6,356,107 B1 | 3/2002 | Tang et al. | |
| 6,539,510 B1 | 3/2003 | St. Pierre, Jr. et al. | |
| 6,714,040 B1 | 3/2004 | Jacobson et al. | |
| 6,898,776 B1 * | 5/2005 | Jacobson et al. | 716/117 |
| 6,948,147 B1 | 9/2005 | New et al. | |
| 7,023,239 B1 * | 4/2006 | Jacobson et al. | 326/38 |
| 7,155,711 B2 * | 12/2006 | Vogel et al. | 717/169 |
| 7,454,556 B1 * | 11/2008 | Knapp | 711/101 |

(Continued)

FOREIGN PATENT DOCUMENTS

EP        0755017        1/1997

(Continued)

OTHER PUBLICATIONS

Ahrens: "Test standard serves dual role as on-board programming solution," Field-Programmable Logic and Applications, 5$^{th}$ Int'l. Workshop, FPL '95 Proceedings, Oxford, UK, Aug. 29-Sep. 1, 1995, pp. 235-240 by Springer-Verlag, Berlin, Germany.

(Continued)

*Primary Examiner* — Guerrier Merant
(74) *Attorney, Agent, or Firm* — Arent Fox LLP

(57) ABSTRACT

Fault tolerant programming of a programmable device advantageously occurs via a host controller that first queries the programmable device through a Boundary scan interface to identify the device. Thereafter, host controller selects a program file in accordance with the device identity for subsequent downloading via the Boundary scan interface to program the device. Thereafter, the host controller verifies that successful programming has occurred.

16 Claims, 2 Drawing Sheets

U.S. PATENT DOCUMENTS

| | | | |
|---|---|---|---|
| 7,505,331 B1 * | 3/2009 | Camarota | 365/189.08 |
| 7,958,416 B1 * | 6/2011 | Camarota | 714/725 |
| 2002/0170000 A1 | 11/2002 | Gorodetsky et al. | |
| 2002/0199110 A1 * | 12/2002 | Kean | 713/189 |
| 2003/0023771 A1 | 1/2003 | Erickson et al. | |
| 2003/0187629 A1 | 10/2003 | Gomez | |
| 2004/0001432 A1 | 1/2004 | Wescott | |
| 2005/0050393 A1 | 3/2005 | Chakrabarty et al. | |
| 2005/0094466 A1 * | 5/2005 | Archer et al. | 365/222 |
| 2005/0240892 A1 | 10/2005 | Broberg, III et al. | |
| 2005/0262396 A1 * | 11/2005 | Woodward et al. | 714/30 |
| 2006/0190905 A1 | 8/2006 | Martin et al. | |
| 2006/0277346 A1 * | 12/2006 | Doak et al. | 710/305 |

FOREIGN PATENT DOCUMENTS

| | | |
|---|---|---|
| JP | 8237110 A | 9/1996 |
| JP | 20030058385 A | 2/2003 |
| TW | 298619 | 2/1997 |

OTHER PUBLICATIONS

Aubert: "Boundary scan modification to enhance multichip module testing," IEEE Proceedings of 1992 National Aerospace and Electronics Conference, NAECON 1992, May 18-22, 1992, Dayton, OH, USA, pp. 979-984, vol. 3, published NY, NY.

Chakraborty et al.: "A novel fault injection method for system verification based on FPGA boundary scan architecture," IEEE Proceedings Int'l. Test Conference 2002, Baltimore, MD, USA, Oct. 7-10, 2002, pp. 923-929, published Piscataway, NJ, USA.

Conner, T.: "Using IEEE 1149.1 for in-system programming (ISP)," Proceedings of the Technical Program NEPCON East '97 Conference, Boston, MA, Jun. 9-12, 1997, pp. 51-54, Reed Exhibition, Norwalk, CT, USA.

Corelis: "Boundary-Scan Tutorial," Innovation in boundary-scan, http://www.corelis.com/products/Boundary-Scan_Tutorial.htm, pp. 1-14.

Gericota et al.: "Draft: an on-line fault detection method for dynamic and partially reconfigurable FPGAs," IEEE Proceedings $7^{th}$ Int'l. On-Line Testing Workshop, pp. 34-36, Taormina, Italy, Jul. 9-11, 2001, published in Los Alamitos, CA, USA.

IEEE Computer Society: "Proceedings DELTA 2004, Second IEEE Intl. Workshop on Electronic Design, Test and Applications," Perth, WA, Australia, Jan. 28-30, 2004, published Los Alamitos, CA, USA.

IEEE Computer Society: "Proceedings Int'l. Test Conference 2004 (IEEE Cat. No. 04CH37586)," Charlotte, NC, USA, Oct. 26-28, 2004, published Piscataway, NJ, USA.

Park et al.: "A New IEEE 1149.1 Boundary Scan Design for the Detection of Delay Defects," Dept. of Computer Science & Engineering Hanyang University, Korea, parksj@mslab.hanyang.ac.kr, 5 pages.

Pottinger et al.: "Using a reconfigurable field programmable gate array to demonstrate boundary scan with built in self test," IEEE Proceedings of Fifth Great Lakes Symposium on VLSI, Buffalo, NY, USA, Mar. 16-18, 1995, pp. 242-245, Los Alamitos, CA, USA.

Stojcev et al.: "Parity error detection in embedded computer system," $5^{th}$ Int'l. Conference on Telecommunications in Modern Satellite, Cable and Broadcasting Service, TELSIKS 2001, vol. 2, pp. 445-450, Nis, Yugoslavia, Sep. 19-21, 2001, Piscataway, NJ, USA.

Ungar et al.: "Testability beyond JTAG," EE Evaluation Engineering, vol. 44, No. 9, pp. 48-50, 52-54, Sep. 2005, Nelson Publishing, USA.

Wikipedia, the free encyclopedia: "Field-programmable gate array," http://en.wikipedia.org/wiki/FPGA, Oct. 17, 2006.

The International Search Report, dated Jun. 21, 2007.

Japanese Office Action in Japanese Patent Application No. 2009-532337 mailed May 18, 2012.

* cited by examiner

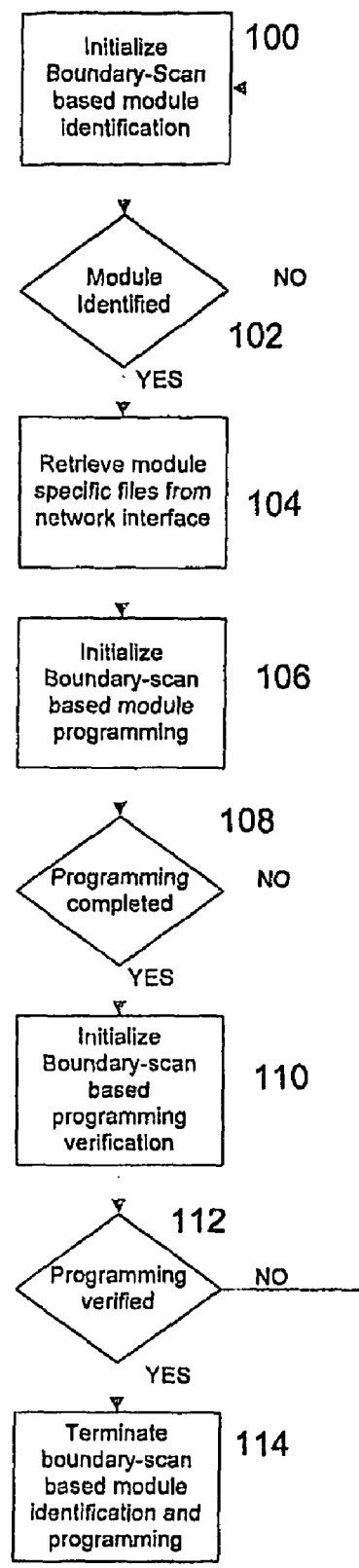
Figure 2 –

TOLERANT IN-SYSTEM PROGRAMMING
OF FIELD PROGRAMMABLE GATE ARRAYS
(FPGAS)

CROSS-REFERENCE TO RELATED
APPLICATIONS

This application claims the benefit, under 35 U.S.C. §365 of International Application PCT/US2006/44951, filed on Nov. 21, 2006, which was published in accordance with PCT Article 21(2) on Apr. 24, 2008, in English and which claims the benefit of U.S. Provisional Patent Application No. 60/851,954, filed on Oct. 16, 2006, in English.

TECHNICAL FIELD

This invention relates to a technique for programming a programmable device, such as a Field Programmable Gate Array.

BACKGROUND ART

Some electronic systems include one or more programmable devices, such as Field Programmable Gate Arrays (FPGAs). A typical FPGA comprises a semiconductor device having a plurality of programmable circuits formed of configurable logic blocks capable of being set to create different logical relationships. Using an FPGA within an electronic system affords the ability to reconfigure one or more logic blocks to alter the FPGA and hence the operation of the electronic system. For example, the ability to reconfigure the FPGA affords the opportunity to fix defects (e.g., "bugs") discovered after manufacture and distribution of the electronic system. Moreover, the reconfigurable nature of FPGAs allows for re-programming to add new features and capabilities to the electronic system.

While there presently exist fault-tolerant methods for re-programming FPGA, such methods lack simplicity and require additional external components. For example, one technique requires the use of use multiple external memory storage elements and selectively programming one for use only if the verification process is successful. Another technique severs to implement a local CPU that can receive and verify the programming data before forwarding such data to the FPGA or its associated memory storage element. Another method commonly used to provide code updates for field programmable devices necessitates the use of field replaceable memory elements. In order to update the operational code for these devices, the equipment must be removed from service to replace the memory elements. Yet another technique requires a physical connection to external programming equipment to provide field programmable memory elements with updates. This manual method requires supervision because a power interruption mid-way through the programming process would cause the programmable device to read incorrect data from the memory storage element.

Thus a need exists for a technique that provides for fault-tolerant programming of a programmable device within a system that overcomes the aforementioned disadvantages of the prior art.

BRIEF SUMMARY OF THE PRESENT
PRINCIPLES

Briefly, in accordance with a preferred embodiment of the present principles, there is provided a technique for programming a programmable device, such as, but not limited to, a Field programmable Gate Array (FPGA). The technique commences by querying the programmable device through a Boundary scan interface to identify the device. Thereafter, the device undergoes programming with at least one program corresponding to the device identity. Thereafter, verification of the programming occurs.

BRIEF DESCRIPTION OF THE DRAWINGS

FIG. 2 depicts a flowchart showing the steps of a method for programming the programmable device of FIG. 1 in accordance with the present principles.

DETAILED DESCRIPTION

Figure 1:
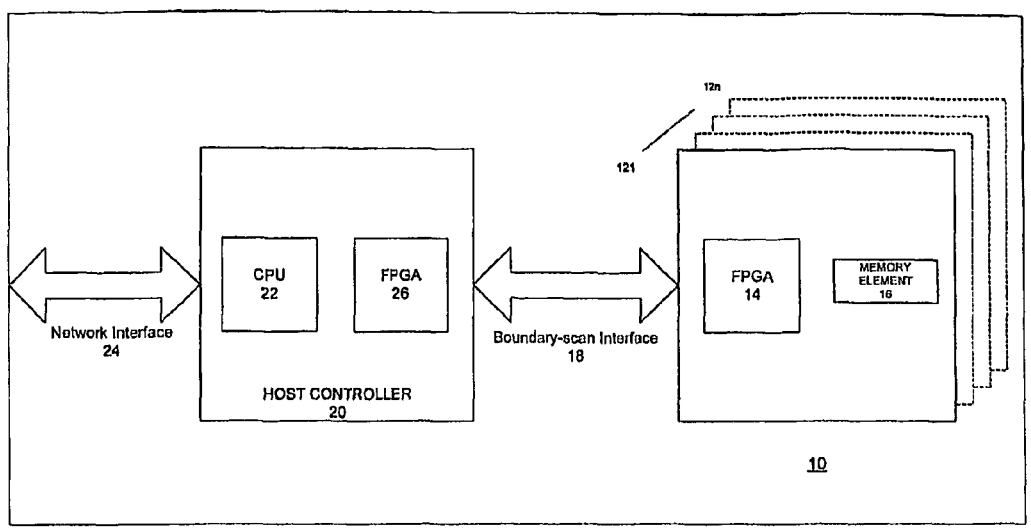
FIG. 1 depicts a block schematic diagram of a system containing a programmable device that undergoes programming through a host controller in accordance with an illustrative embodiment of the present principles.

As discussed in greater detail hereinafter, in accordance with the present principles, there is provided a technique for fault-tolerant programming a programmable device, such as a Field Programmable gate Array, (FPGA) through a Boundary scan interface in an automated manner. In practice, two methods exist for of re-programming an FPGA, one temporary and the other permanent. While the technique of the present principles described hereinafter has applicability to both temporary and permanent programming, the following description focuses on the permanent programming of the FPGA. FPGAs generally include a storage element to store a custom program that describes its behavior. This storage element can exist within the FPGA or it can exist externally. As described hereinafter, the technique of the present principles can permanently program this storage elements so that the FPGA can read the new program stored in the memory storage element during subsequent power up conditions.

The programming technique of the present principles can best be understood by reference to FIG. 1 which comprises a system 10 that includes at least one, and preferably a plurality of modules $12_1$-$12_n$ that perform various signal processing functions. For example, one or more of the modules could process one or more of video, audio, time code and ancillary information. At least one module, such as module $12_1$, has at least one programmable device, such as a FPGA 14, and can include other devices, such as memory element 16 for example, which as discussed above can undergo programming in accordance with the present principles. During, operation, the FPGA 14 can read the memory element 16 to alter the FPGA behavior.

In practice, the FPGA 14 has one or more configurable logic blocks (not shown) which can be set and thereafter reset in response to programming of the FPGA though an interface. In the past, fault tolerant programming of the FPGA 14 on the module $12_1$ typically required that a technician travel to the location of the system 10 to gain physical access to the module. Often, the technician needed special equipment for this task, making such re-programming costly and time-consuming.

Fault tolerant programming of the FPGA 14 can occur without manual intervention using the technique of the present principles which makes use of a Boundary scan interface 18 between the electronic system 10 and a host controller 20. To understand the nature of the Boundary scan interface 18, a brief discussion of the Boundary scan test technique will prove useful. The Boundary scan technique, as defined in the IEEE 1149.1 Joint Test Action Group (JTAG) standard (incorporated by reference herein), provides a mechanism for testing a large scale integrated circuit (or a combination of interconnected circuits) without the need to necessarily access individual pins on each circuit. Instead, one or more pins of an integrated circuit (or the pins of two or more circuits) to a Boundary scan interface which provides a mechanism for connecting a signal from an external source to such pins circuits. The pins of the integrated circuit(s) coupled to the Boundary scan interface have associated Boundary scan cells within the respective integrated circuit(s) that are coupled in a serial chain so that a signal launched into one pin gets serially shifted through the chain and out through another pin. A given signal launched into a particular integrated circuit, or a combination of interconnected circuits, via the Boundary scan interface will yield a signal indicative of the circuit or combination of circuits.

The host controller 20 undertakes the programming of the FPGA 14 on the module $12_1$ (as well as the programming of other programmable devices on other modules if appropriate) under control of a central processing unit (CPU) 22. The CPU 24 of the host controller 20 can receive both command and program information through a network interface 24. In response to a command to initiate programming, the CPU 22 will first identify the module and thereafter supply programming to the module $12_1$ corresponding to the identification for receipt by the FPGA 14 or by the memory element 16 on that module. For example, the CPU 22 could accomplish such programming following module identification by first programming a FPGA 26 associated with the host controller 20, and then replicating that program to the FPGA 14 or memory element 16 on the module $12_1$. Other programmable devices on other modules could undergo programming in the same manner. Rather than make use of the FPGA 26 on the host controller 20 to store programming information for later transfer to a programmable device, such as FPGA 14, on a module such as module $12_1$, the host controller could employ another type of memory for that purpose.

The host controller 20 identification of the FPGA 14 identification involves utilization of a JTAG idcode assigned to the FPGA 14 upon its manufacture. The host controller 20 makes use of the JTAG idcode and the assigned I/O pins of the FPGA to uniquely identify the target program for the module. This method allows for multiple modules that use the same type of FPGAs (those having the same idcode) to have different programs based on the additional configuration of the assigned FPGA I/O pins. By using both the idcode and the assigned FPGA I/O pins, the host controller 20 can make the proper identification of the target program, thereby allowing multiple modules using the same or different types of FPGAs to communicate with a single host controller to obtain the correct target program code. In the case of multiple modules, the modules typically connect with each other through their Boundary scan interfaces in one or more JTAG chains.

FIG. 2 depicts in flow chart form the steps of an exemplary method employed by the host controller 20 of FIG. 1 to program a programmable device (e.g., FPGA 14) on one or more of the modules $12_1$-$12_n$ of FIG. 1. The method commences upon execution of step 100 of FIG. 2 during which the host controller 20 initializes Boundary scan-based module identification. To that end, the host controller 20 launches a signal, typically in the form of a vector containing a plurality of known values, into the Boundary scan interface 18 of FIG. 1, causing the module $12_1$ of FIG. 1 to generate a particular response based on the nature of the module. The host controller 20 then analyzes the response, taking into account the JTAG idcode and FPGA I/O pin assignments as discussed previously. By launching a signal to the module, and then analyzing the response, the host controller 20 thus serves to query the module to ascertain its identity. Following step 100, the host controller 20 determines whether it can identify the module based on the response received from the module during step 102 of FIG. 2. If the host controller 20 of FIG. 1 cannot successfully identify the module, step 100 gets repeated until successful module identification occurs. Note that a module, such as module $12_1$ could contain a single programmable device, such as FPGA 14. Thus, by initiating querying of such a module $12_1$ during step 100, the host controller effectively queries the programmable device.

Upon successful module identification, the host controller 20 will retrieve one or more specific program files for the corresponding identified module during step 104. In practice, the host controller 20 of FIG. 1 typically retrieves the corresponding module-specific program file(s) from an external source (not shown) through the network interface 24 of FIG. 1. Alternatively, the host controller 20 could retrieve the corresponding module-specific program files from a local memory (not shown).

Following retrieval of the corresponding module-specific program file(s) during step 104, the host controller initializes Boundary-scan-based module programming during step 106. To that end, the host controller 20 downloads the module-specific program file(s) through the Boundary-scan interface 18 of FIG. 1 to program the programmable logic blocks within the FPGA 14 in the given module. (In the event the programmable device on the module operates in a different way, the host controller 20 will download the module-specific program file(s) in a manner to reprogram that device).

During step 108, the host controller 20 checks whether programming has been completed. If not, program execution branches back to step 100 and those following it. Returning to the first step (step 100) in the programming process, rather than repeating step 106 helps to make the programming process fault tolerant. Simply repeating step 106 upon a determination of incomplete programming during step 108 could run the risk that programming ultimately performed could result in flaws. In contrast, restarting the programming process by returning to step 100 upon a determination of incomplete programming during step 108 greatly reduces the likelihood of programming flaws.

After execution of step 108 of FIG. 2, step 110 next undergoes execution during which the host controller 20 of FIG. 1 initializes Boundary-scan-based programming verification. During step 112, the host controller 20 determines whether programming verification has occurred successfully. If not, then step 100 and those following it get re-executed to assure fault tolerance in the same manner as discussed above. Upon successful programming verification during step 112, the host controller 20 of FIG. 1 terminates the boundary-scan-based module identification and programming process during step 114.

The foregoing describes a technique for fault-tolerant programming of a programmable element that does not require manual intervention.

The invention claimed is:

1. A method for programming programmable devices comprising:
    querying at least one of the programmable devices through a Boundary-scan interface to ascertain device identity, wherein the querying is based on an identification code and an additional configuration of assigned input and output pins on the at least one of the programmable devices;

programming the at least one programmable device through the Boundary-scan interface with at least one program corresponding to the device identity; and verifying that the at least one programmable device has been successfully programmed, wherein the at least one programmable device comprises a field programmable gate array.

2. The method according to claim 1, wherein the querying comprises:

launching a signal via the Boundary scan interface into the programmable device to cause the device to generate a response, wherein the signal comprises a vector comprising a plurality of known values; and analyzing the response to identify the device.

3. The method according to claim 2, further comprising repeating the launching and the analyzing until successful device identification.

4. The method according to claim 1, further comprising repeating querying and programming until successful verification of device programming.

5. A method for operating a programmable device to accomplish device reprogramming, comprising:

generating a response signal through a Boundary-scan interface associated with the device upon receipt of a signal launched into the device to ascertain device identity, wherein ascertaining device identify is based on an identification code and an additional configuration of assigned input and output pins of the programmable device;

receiving a program file through the Boundary-scan interface with at least one program corresponding to the device identity; and providing verification that the programmable device has been successfully programmed.

6. An apparatus for programming a programmable device, comprising:

a Boundary scan interface coupled to the programmable device;

means for querying the programmable device through the Boundary-scan interface to ascertain device identity, wherein the means for querying includes means for using an identification code and an additional configuration of assigned input and output pins on the programmable device to ascertain device identity;

means for programming the programmable device through the Boundary-scan interface with at least one program corresponding to the device identity; and means for verifying that the programmable device has been successfully programmed, wherein the programmable device comprises a field programmable gate array.

7. The apparatus according to claim 6, wherein the means for querying and the means for verifying comprise a central processing unit.

8. The apparatus according to claim 6, wherein the means for programming comprises a programmable device.

9. The apparatus according to claim 7, wherein the programmable device comprises a Field Programmable Gate Array.

10. The method according to claim 7, further comprising:

identifying at least one program in accordance with the device identity and the additional configuration of assigned device input/output pins for the device, wherein programming the at least one programmable device through the Boundary-scan interface includes programming the at least one programmable device with the identified program.

11. The apparatus according to claim 5, wherein the programmable device comprises a field programmable gate array.

12. The apparatus according to claim 5, wherein the signal comprises a vector comprising a plurality of known values.

13. The apparatus according to claim 6, wherein the means for querying the programmable device launches a signal via the Boundary scan interface into the programmable device to cause the device to generate a response, and wherein the signal comprises a vector comprising a plurality of known values, and analyzes the response to identify the device.

14. The apparatus according to claim 13, wherein the means for querying the programmable device is configured to repeat the launching and the analyzing until successful device identification.

15. The apparatus according to claim 13, wherein the means for querying the programmable device and the means for programming the programmable device are configured to repeat the querying and the programming until successful verification of device programming.

16. The apparatus according to claim 13, further comprising:

means for identifying at least one program in accordance with the device identity and the additional configuration of assigned device input/output pins for the device, wherein the means for programming the at least one programmable device through the Boundary-scan interface programs the at least one programmable device with the identified program.

* * * * *